United States Patent
Nishizawa

(10) Patent No.: US 7,349,626 B2
(45) Date of Patent: Mar. 25, 2008

(54) IMAGING APPARATUS

(75) Inventor: Hiroshi Nishizawa, Yokohama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 312 days.

(21) Appl. No.: 10/538,559

(22) PCT Filed: Apr. 7, 2004

(86) PCT No.: PCT/JP2004/005025

§ 371 (c)(1),
(2), (4) Date: Jun. 13, 2005

(87) PCT Pub. No.: WO2004/098174

PCT Pub. Date: Nov. 11, 2004

(65) Prior Publication Data

US 2006/0251414 A1 Nov. 9, 2006

(30) Foreign Application Priority Data

Apr. 28, 2003 (JP) ............... 2003-123829

(51) Int. Cl.
G03B 7/099 (2006.01)

(52) U.S. Cl. ............ 396/275; 396/268; 348/340; 348/342; 257/443

(58) Field of Classification Search ........ 396/268, 396/275; 348/340, 342; 257/443
See application file for complete search history.

(56) References Cited

U.S. PATENT DOCUMENTS 6,372,859 B1 * 4/2002 Sakata et al. ............ 525/432
6,707,125 B2 * 3/2004 Harazono ................ 257/434
2003/0094665 A1 * 5/2003 Harazono ................ 257/432
2003/0112714 A1 * 6/2003 Harazono ................ 369/18
2003/0128442 A1 * 7/2003 Tanaka et al. ........... 359/819
2003/0155639 A1 * 8/2003 Nakamura et al. ...... 257/680
2004/0222352 A1 * 11/2004 Nishizawa ............ 250/208.1
2005/0001331 A1 * 1/2005 Kojima et al. .......... 257/778
2005/0270403 A1 * 12/2005 Adachi et al. ........... 348/340

FOREIGN PATENT DOCUMENTS

| JP | 2001-036777 | 2/2001 |
| JP | 2001-108878 | 4/2001 |
| JP | 2001-245186 | 9/2001 |
| JP | 2001-292363 | 10/2001 |
| JP | 2004-096638 | 3/2004 |
| JP | 2004-145039 | 5/2004 |

* cited by examiner

Primary Examiner—W. B. Perkey
Assistant Examiner—Warren K Fenwick
(74) Attorney, Agent, or Firm—Pearne & Gordon LLP

(57) ABSTRACT

The imaging apparatus 1 comprises: a semiconductor imaging device 5 which converts incident light to an electrical signal; an optical filter 4 which is opposed to an incident surface of the semiconductor imaging device 5 and transmits light of a certain wavelength; and a three-dimensional substrate 2 fixing the optical filter 4 by means of adhesion using a filler-containing adhesive 6; wherein the diameter of the filler is smaller than or equal to the pixel size of the semiconductor imaging device 5. Degradation of image quality of the imaging apparatus 1 caused by the dropped filler can thus be reduced.

14 Claims, 5 Drawing Sheets

IMAGING APPARATUS

TECHNICAL FIELD

The present invention relates to an imaging apparatus using a semiconductor imaging device, the imaging apparatus used as a camera for a portable device or the like.

BACKGROUND ART

As described in Japanese Patent Laid-Open Application No. 2001-245186 etc., previously known is an imaging apparatus configured to convert an image, imaged by a lens, to an electrical signal using a CCD or other semiconductor imaging device so as to capture the image. With demand for smaller and more sophisticated portable devices, imaging apparatuses have been required to be even smaller and lighter in weight. Accordingly, imaging apparatuses have been made thinner by thinning each component. On the other hand, the number of pixels has been increased in accordance with requirements for high image quality, and therefore the size of a pixel has also been miniaturized.

In the field of imaging apparatuses, a black or white dot or the like on an image caused by a flaw in an imaging device or by dirt sticking to an imaging device is commonly called a "blemish." In order to prevent dirt from sticking to an imaging device resulting in a blemish, various measures have previously been taken in assembly of an imaging apparatus, such as improvement in work environment cleanliness, intensifying cleaning, or active elimination of static electricity using an ionizer or the like. Moreover, if dirt or the like causes a decrease in output from a certain pixel, a blemish correction is made such that the output from the pixel is estimated based on information obtained from the neighboring pixels and is corrected as though the pixel worked normally.

As described above, the occurrence of blemishes caused by dirt has been reduced by reducing the occurrence of relatively large dirt by assembling in a clean environment, and by estimating an output from a pixel using blemish correction when small dirt sticks to an imaging device.

DISCLOSURE OF INVENTION

An imaging apparatus described in the above patent document is provided with an optical filter adjacent to a semiconductor imaging device so as to allow light of a certain wavelength to enter the semiconductor imaging device. This optical filter is fixed by an adhesive, dust generated from which may also cause degradation in image quality of the imaging apparatus and may prevent high image quality even if dirt generated in the assembly environment is reduced. Specifically, filler contained in the adhesive may be released at the time of adhesion of the optical filter or may drop after cure of the adhesive, so that a problem occurs that the released or dropped filler sticks to the incident surface of the semiconductor imaging device and degrades image quality.

A purpose of the invention made to solve the above-mentioned subject is to provide an imaging apparatus with reduced degradation of image quality caused by released or dropped filler.

To achieve the above-mentioned purpose, an imaging apparatus according to the invention comprises: a semiconductor imaging device which converts incident light to an electrical signal; an optical filter which is opposed to an incident surface of the semiconductor imaging device and transmits light of a certain wavelength; and a fixing member fixing the optical filter by means of adhesion using a filler-containing adhesive; wherein a diameter of the filler is smaller than or equal to a pixel size of the semiconductor imaging device.

In this configuration, even if the filler contained in the adhesive to glue the optical filter is released at the time of adhesion or drops after cure of the adhesive, outputs can certainly be obtained from the neighboring pixels and an image correction can be made based on the outputs from the neighboring pixels, since the diameter of the filler sticking to the surface of the semiconductor imaging device is smaller than or equal to the pixel size. In this way, a correction can be made such that the image is substantially free from filler, so that image degradation can be reduced. Incidentally, the fixing member may be a substrate fixing the semiconductor imaging device.

The fixing member of the imaging apparatus according to the invention is a three-dimensional substrate.

In an imaging device using a three-dimensional substrate as a fixing member, components mounted to the three-dimensional substrate are arranged intensively. Therefore, it is preferred that the invention, which can reduce image degradation caused by filler dropping from the adhesive, is applied to such a case.

An imaging apparatus according to the invention comprises: a semiconductor imaging device which converts incident light to an electrical signal; and a substrate fixing the semiconductor imaging device by means of adhesion using a filler-containing adhesive; wherein a diameter of the filler is smaller than or equal to a pixel size of the semiconductor imaging device.

In this configuration, even if the filler contained in the adhesive to glue the semiconductor imaging device is released at the time of adhesion or drops after cure of the adhesive, outputs can certainly be obtained from the neighboring pixels and an image correction can be made based on the outputs from the neighboring pixels, since the diameter of the filler sticking to the surface of the semiconductor imaging device is smaller than or equal to the pixel size. In this way, a correction can be made such that the image is substantially free from filler as dirt, so that image degradation can be reduced.

Additionally, in the imaging apparatus according to the invention, the diameter of the filler is larger than or equal to ½ of a pixel size of the semiconductor imaging device.

By using the filler the diameter of which is larger than or equal to ½ of a pixel size, dispersibility of the filler can be maintained and the adhesive can function appropriately.

Moreover, in the imaging apparatus according to the invention, the filler is spherical in shape.

This configuration can eliminate thermal expansion anisotropy of the adhesive to reduce anisotropy of the fixing member or substrate to be glued. In this way, the fixing member or substrate can be strengthened and the imaging apparatus can be thinned down.

BEST MODE OF EMBODYING THE INVENTION

Figure 1:
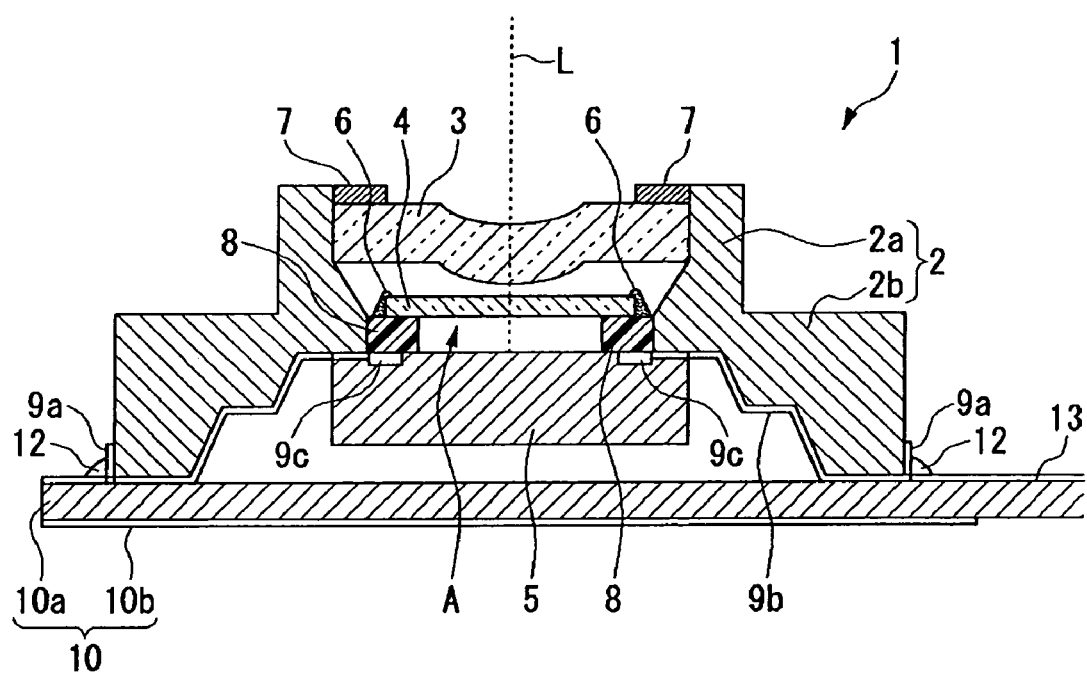
FIG. 1 shows a cross section of an imaging apparatus according to an embodiment.

An imaging apparatus according to an embodiment of the invention will now be described referring to the drawings. If possible, the same parts are designated by the same letters and are not described repeatedly.

Figure 2:
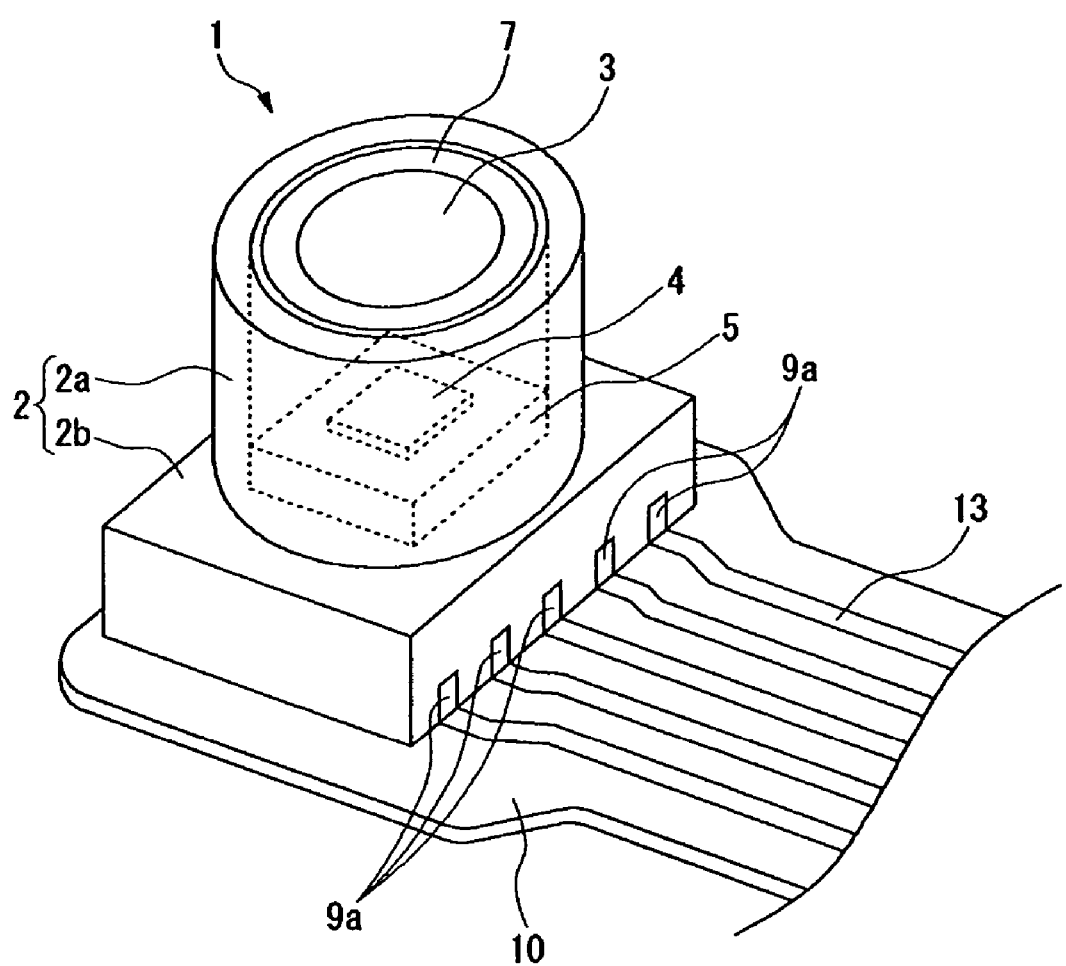
FIG. 2 shows a perspective view of the imaging apparatus according to the embodiment.
Figure 3:
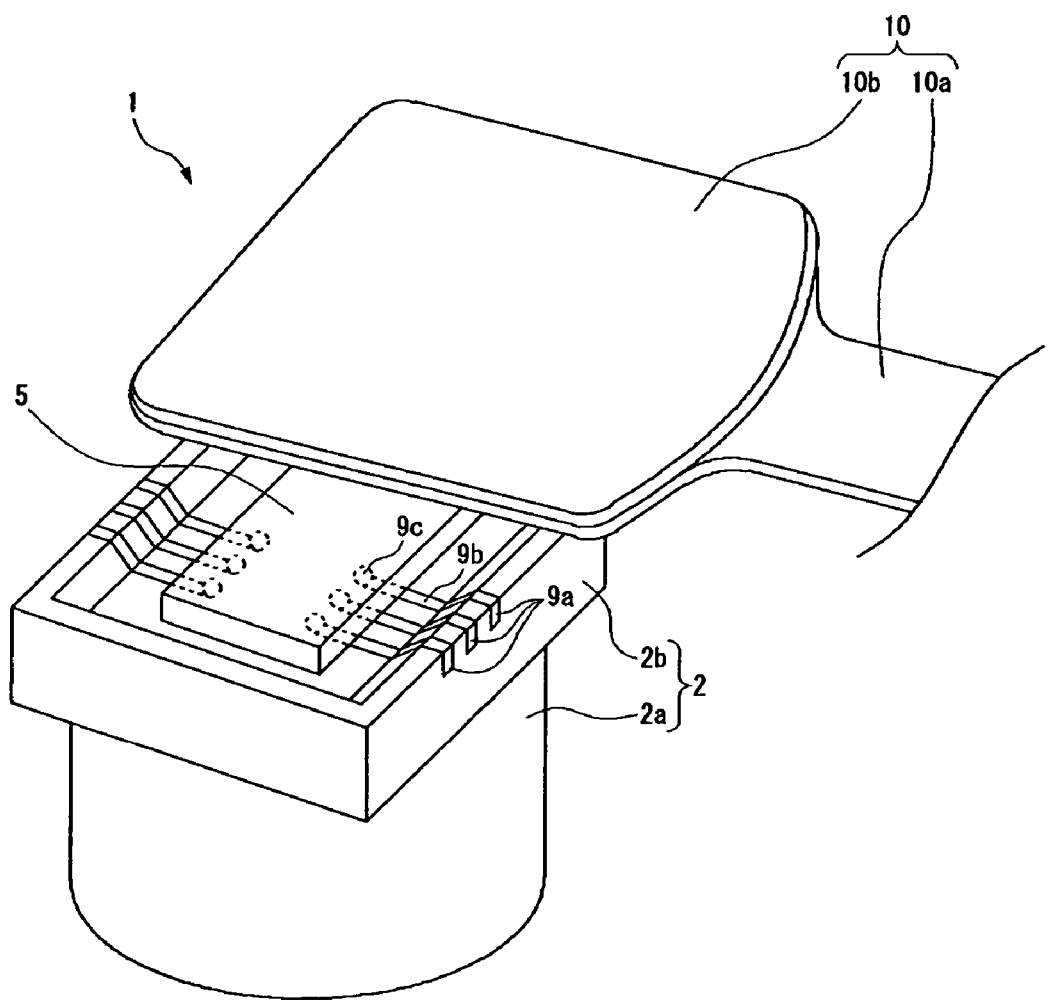
FIG. 3 is an exploded perspective view of the major part of the imaging apparatus according to the embodiment.

FIG. 1 shows a cross section of an imaging apparatus 1 according to an embodiment, FIG. 2 shows a perspective view of the imaging apparatus 1, and FIG. 3 is an exploded perspective view of the major part of the imaging apparatus 1 shown in FIG. 2 when seen from the back. As shown in FIG. 1, the imaging apparatus 1 according to the embodiment has an aspherical lens 3, an optical filter 4, a semiconductor imaging device 5, which are placed along an optical axis L; a three-dimensional substrate 2 fixing these three, and a printed circuit board (FPC) 10 connected to the three-dimensional substrate 2. In this embodiment, the three-dimensional substrate 2 has a role in fixing the semiconductor imaging device 5 along with a role as a fixing member to fix the optical filter 4. The three-dimensional substrate 2 is composed of a cylindrical lens barrel portion 2a and a base portion 2b extending from an end face of the lens barrel portion 2a (see also FIG. 2). In the description below, the side of the lens barrel portion 2a is referred to as the upward direction and the side of the base portion 2b is referred to as the downward direction.

For a start, the three-dimensional substrate 2 will be described. The lens barrel portion 2a is positioned on the top side of the base portion 2b and extends in the upward and downward directions. A hollow is formed in the center of the underside of the base portion 2b. An opening A centered on the optical axis L is formed on the base portion 2b, and light can pass through the opening A and the cavity of the lens barrel portion 2a. The three-dimensional substrate 2 is composed of glass-reinforced PPA (polyphthalamide) or the like and is blackened in order to prevent light from passing through it. A required wiring pattern 9b is formed on the underside of the base portion 2b by electroless plating or the like. This wiring pattern 9b has a connecting land 9c provided on the underside of the base portion 2b of the three-dimensional substrate 2 in order to allow the semiconductor imaging device 5 to be mounted bare, and has a terminal portion 9a provided on the outside of the base portion 2b of the three-dimensional substrate 2 for connection with the outside world (see FIG. 2).

The aspherical lens (hereinafter referred to as "lens") 3 is composed of a resin capable of meeting optical characteristic requirements such as transmissivity and refractive index, and is fitted into the inner radius of the lens barrel portion 2a of the three-dimensional substrate 2. In this embodiment, ZEONEX (registered trademark) manufactured by ZEON Corporation is used for the lens 3. Although FIG. 1 shows only one lens for the sake of simplicity, the lens 3 actually comprises two pieces of lens and is adapted to be so-called pan focus capable of forming images of subjects which are farther than a certain distance. The lens 3 is adapted to focus on subjects which are farther than approximately 30 cm in this embodiment. However, the configuration and characteristics of the lens 3 can be chosen if required without being limited to those of the embodiment. An aperture 7 which fixes lens 3 and is a required opening is attached above the lens 3.

Figures 4, 5:
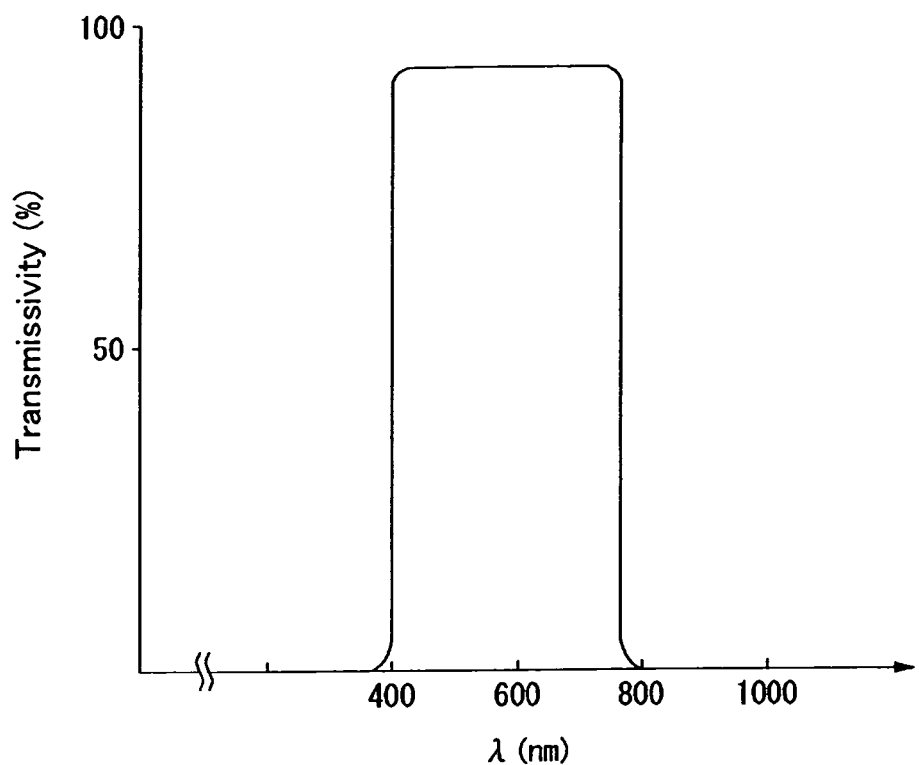
FIG. 4 shows spectral characteristics of an optical filter according to the embodiment.
FIG. 5 shows a schematic diagram of an arrangement of colors of pixels in a CCD according to the embodiment.

The optical filter 4 is given IR (infrared) cut coating on one side of lead-glass base material, and AR (antireflection) coating on the other side. Silicon dioxide ($SiO_2$), titanium oxide $TiO_2$, and the like, for example, are used for IR cut coating and evaporated onto the base material. As for AR coating for antireflection, aluminum oxide ($Al_2O_3$), magnesium fluoride ($MgF_2$), zirconium oxide ($ZrO_2$), and the like, for example, are used and evaporated onto the base material. Since the optical filter 4 uses lead glass as its base material, it can restrain ultraviolet light from passing through it. With such a structure, the optical filter 4 has a function of restraining light outside the visible light region from passing through it. As can be seen from FIG. 4 showing spectral characteristics of the optical filter 4 according to the embodiment, transmissivity is set to about 93% or more in the region from approximately 400 nm to approximately 800 nm and is set sufficiently low outside the region. However, the spectral characteristics of the optical filter 4 can be changed if required without being limited to that of the embodiment. This optical filter 4 placed above the opening A along the optical axis L and is fixed to the three-dimensional substrate 2 by a UV-curing epoxy adhesive 6. The AR-coated side of the optical filter 4 is opposite to the lens 3.

The semiconductor imaging device 5 is a ⅙-inch VGA CCD with approx. 320,000 pixels, the pixel size of which is approx. 3.8 μm. The semiconductor imaging device 5 is mounted on the connecting land 9c provided on the three-dimensional substrate 2 by so-called face down mounting such as SBB (stud bump bond) or other connection method and is electrically connected with the wiring pattern 9b. The semiconductor imaging device 5 uses color filters using coloring matter, not shown in FIGS. 1 to 3, so as to obtain RGB signal output separately, and light receiving elements corresponding to each color are formed.

FIG. 5 is a schematic diagram showing an example of an arrangement of colors in the semiconductor imaging device 5. In FIG. 5, a part indicated by, for example, "R" receives light of the red wavelength which passed through a color filter, and therefore can detect light of the red wavelength. Similarly, a part indicated by "B" receives light of the blue wavelength which passed through a color filter and a part indicated by "G" receives light of the green wavelength which passed through a color filter. The semiconductor imaging device 5 is placed around the center of the underside of the base portion 2b such that it covers the opening A and its imaging surface (incident surface) is opposite to the optical filter 4. Since the hollow is formed in the center of the base portion 2b as described above, the semiconductor imaging device 5 attached to its underside is distant from the FPC 10. Additionally, chip components and the like, not shown, are also placed on the underside of the base portion 2b.

As can be seen from the above description, the optical system of the imaging apparatus 1 of the embodiment is configured such that light from a subject is concentrated by the lens 3, passes through the optical filter 4 which transmits light of the visible light region, and enters the semiconductor imaging device 5.

The FPC 10 provided below the three-dimensional substrate 2 is connected electrically and fixed mechanically to the terminal portion 9a of the three-dimensional substrate 2 at the land 13 on the FPC 10 by solder 12. The FPC 10 is composed of a ½-mil (12.5 μm) thick polyimide base film 10a and ⅓-oz. (12 μm) thick rolled copper 10b. The FPC 10 is provided with a DSP (digital signal processor) for signal processing, not shown, and the like. The DSP has functions to convert electrical signals outputted from the semiconductor imaging device 5 into signals of a required form and to conduct processes such as white balance and color correction, and is connected with equipment such as a cell phone or portable device.

The DSP also has a function called "blemish correction." "Blemish correction" is to cope with a pixel which outputs nothing due to a flaw in the CCD or dirt so that the output from the defective pixel is estimated based on information obtained from pixels placed around that pixel and is corrected as though the pixel worked normally. A method using an average of outputs from neighboring pixels, a method using interpolation from outputs from neighboring pixels, or the like can be used as a blemish correction method. As to identifying a blemish, it is judged by whether or not an output from a target pixel exceeds a certain threshold or falls below another threshold within a certain finite range.

This imaging apparatus 1 operates as follows. Light from a subject passes through the aperture 7 and is concentrated by the lens 3. Light concentrated by the lens 3 then enters the optical filter 4, which cuts down infrared light and ultraviolet light. Visible light transmitted through the optical filter 4 enters the semiconductor imaging device 5 to be converted into a required electrical signal, which is then outputted from the semiconductor imaging device 5. The electrical signal outputted from the semiconductor imaging device 5 is derived via the wiring pattern 9b to the terminal portion 9a provided on the base portion 2b, so that the imaged image is displayed on a display not shown in the figure. The display has an aspect ratio of 4:3 and is configured to output at a frame rate of 30 frames per second.

Now, an assembly order of the imaging apparatus 1 according to the embodiment will be described. First, the optical filter 4 is set to the three-dimensional substrate 2, and then a required amount of the UV-curing epoxy adhesive 6 is applied to the circumference of the optical filter 4 by a dispenser or the like. Next, the adhesive 6 is cured to set by an ultraviolet irradiation apparatus not shown. The wavelength, irradiation time, and the like of the applied ultraviolet rays are preferably optimized according to the curing conditions of the adhesive 6. When an adhesive compounded to be thermally cured after UV curing is used, its cure initiator is activated by ultraviolet irradiation and then the cure is completed by heat. Next, the semiconductor imaging device 5 is glued onto the underside of the base portion 2b of the three-dimensional substrate 2. At this time, the semiconductor imaging device 5 is placed such that its imaging surface is opposed to the opening A. Then, above the optical filter 4, the lens 3 is placed in the three-dimensional substrate 2, and the lens 3 is fixed by attaching the aperture 7 which presses down the lens 3 from above. Finally, the three-dimensional substrate 2 to which the optical filter 4, the semiconductor imaging device 5, and the like are attached is placed on the FPC 10, and both are fixed to each other by solder 12, so that the imaging apparatus 1 is brought to completion.

The adhesive 6 to glue the optical filter 4 to the three dimensional substrate 2 will now be described. As mentioned above, glass-reinforced PPA (polyphthalamide) is used for the three-dimensional substrate 2, and its linear expansion coefficient is approx. $40 \times 10^{-6}$/K. On the other hand, the linear expansion coefficient of the optical filter 4 is approx. $10 \times 10^{-6}$/K. In order to bond these two properly, the adhesive 6 contains filler, not shown, so that the linear expansion coefficient of the adhesive 6 is between the linear expansion coefficient of the three-dimensional substrate 2 and the linear expansion coefficient of the optical filter 4. Additionally, the filler is composed of silicon dioxide ($SiO_2$) so as to be suited for optics use. Moreover, the filler is preferably spherical in shape so that the adhesive 6 does not have anisotropy after curing.

Before describing the diameter of the filler, problems caused by adhesives containing filler will be described. When an adhesive cures, filler contained in the adhesive may be released, or some of the filler, particularly at an end face, may expose. After the optical filter 4 is attached to the three-dimensional substrate 2, the imaging device 5 and the lens 3 of the optical system is attached, the FPC 10 is mounted, and a focus adjustment operation is conducted as required. Handling or shock during these processes may cause a drop of the filler at the end face. The released or dropped filler then sticks to the surface of the imaging device 5 and causes a decrease in output from the pixel, which became evident through an analysis of the imaging apparatus 1. Particularly recently, as imaging apparatuses get smaller, it has become difficult to find enough room required for disassembling those apparatuses, and thus many apparatuses cannot be disassembled. Such imaging apparatuses may have to be discarded if the released or dropped filler sticks to the surface of their imaging device.

In the imaging apparatus 1 according to the embodiment, the optical filter 4 is glued using the adhesive 6, the filler diameter of which is smaller than or equal to the pixel size. As a result, even if the released or dropped filler sticks to the surface of the semiconductor imaging device 5, an image equal to a filler-free image can be obtained by blemish correction.

Moreover, according to the embodiment, possible black dots or the like of an image caused by filler can be corrected using a function of correcting a blemish caused by a defect in a CCD or the like (blemish correction function) which has previously been provided to imaging apparatuses, and therefore processes, manufacturing methods, facilities, or the like require no modification. In other words, degradation of image quality caused by filler can be reduced without lowering the workability of the assembly of imaging apparatuses.

Figure 6:
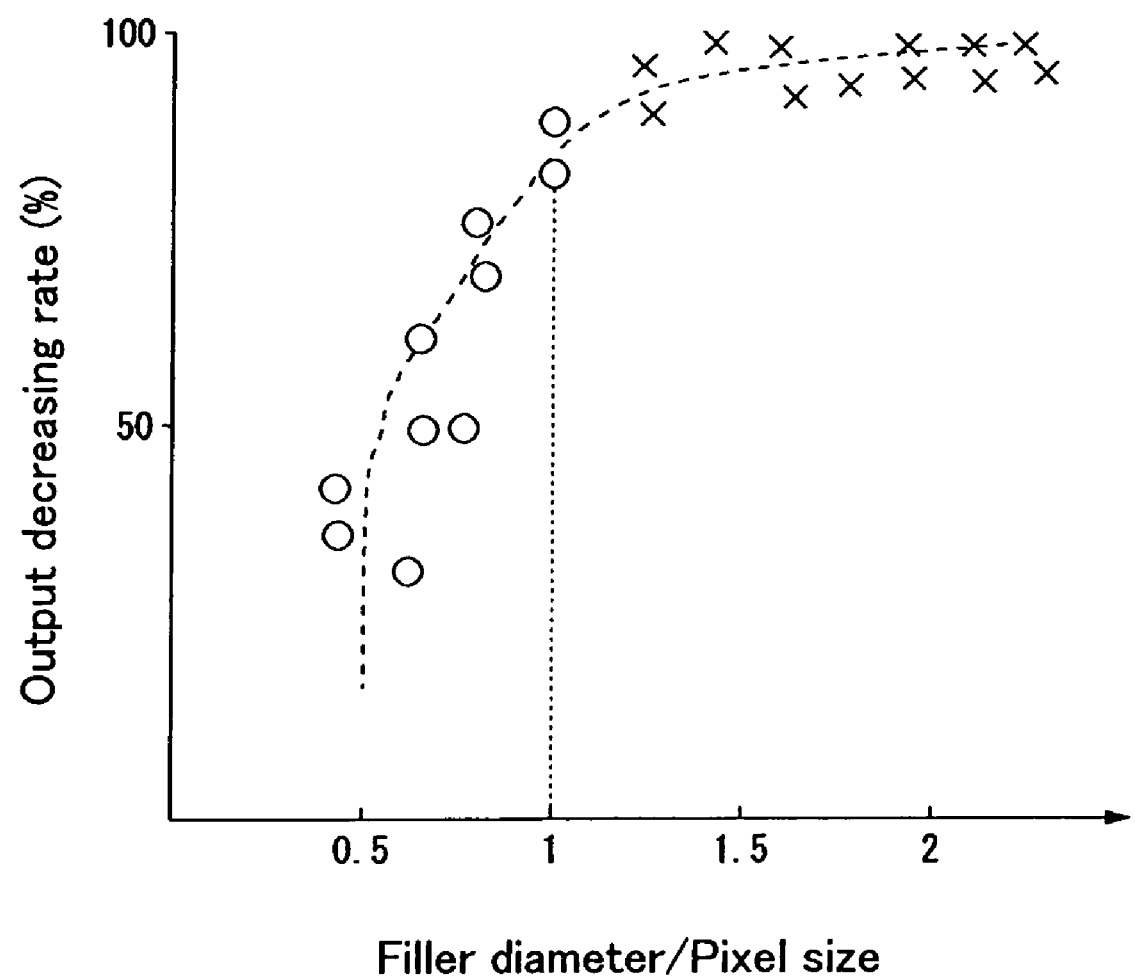
FIG. 6 shows output characteristics relative to the filler and pixel size according to the embodiment.

FIG. 6 shows variations in output characteristics relative to the filler and pixel size. The relation between the ratio of the filler size contained in the adhesive 6 to the pixel size and a decrease in output from the imaging device 5, and a result of an experiment on whether blemish correction succeeded or not will be described referring to FIG. 6. In FIG. 6, the horizontal axis shows ratio of the filler size to the pixel size. In this embodiment, the pixel size is 3.8 µm as mentioned above, so "1" on the horizontal axis indicates that the filler size (diameter) is 3.8 µm, which is equal to the pixel size. "2" on the horizontal axis means that the filler size is twice as large (7.6 µm) as the pixel size. The vertical axis shows as output decreasing rate how much the output from the imaging device 5 decreased. "○" is plotted when an image was successfully corrected by blemish correction such that no blemish was recognized in the output image, and "X" is plotted when an image was not successfully corrected and blemish was recognized. As can be seen from the result shown in FIG. 6, an area around the value "1" on the horizontal axis forms the boundary between whether a blemish was able to be corrected or not. The size of filler which attaches to the imaging device 5 falls under two ranges. Within one range, information required for conducting blemish correction based on outputs from the surrounding pixels can be obtained, and within the other range, it cannot be obtained. Between the two ranges exists a certain filler diameter which forms the boundary. The experimental result shown in FIG. 6 indicates that the boundary of the filler diameter which determines the success or failure of blemish correction is about the pixel size.

Since blemish correction can usually be made if dirt or other foreign matter does not cover two neighboring pixels, it would appear that correction can be made even if the diameter of the filler is larger than the pixel size. However, according to an actual study on the relationship between the filler size and the possibility of correction using blemish correction, it is recognized, as mentioned above, that blemish correction cannot be made and the blemish appears on the output image as a black dot or the like if the filler size exceeds the neighborhood of the pixel size. This may be due to the following reason. The part of the imaging surface which is influenced by filler attaching to the imaging device 5 is the part shadowed by the filler. The farther the filler is from the optical axis L, the larger the area shadowed by the filler (projected area) becomes. Since the location on the optical filter 4 at which the adhesive is applied corresponds to a location distant from the optical axis L, filler dropped therefrom is likely to stick at a location distant from the optical axis L. As mentioned above, the projected area of a filler distant from the optical axis L is large, so that the projected area of a filler whose diameter is equal to the pixel size corresponds to approx. two pixels, and therefore blemish correction will be difficult due to the shadow of the filler. For the above reason, it is presumed that an image cannot be corrected by blemish correction when the diameter of a filler exceeds a size corresponding to one pixel.

On the other hand, a further analysis revealed that when the filler size is smaller than about ½ of the pixel size, a decrease in output from a pixel is considerably small and blemish correction can certainly be made even if a filler sticks to the imaging surface. This is probably because when a filler is smaller than about ½ of a pixel, the projected area of the filler does not become as large as one pixel. However, if the filler size is extremely small, dispersibility of the filler decreases. Therefore, the diameter of the filler is preferably larger than or equal to ½ of the pixel size in order to allow the adhesive to function appropriately.

For the same purpose of reducing image degradation caused by released or dropped filler attaching to the semiconductor imaging device 5, it is preferred that an adhesive whose filler diameter is smaller than the pixel size and larger than or equal to ½ of the pixel size is also used when the semiconductor imaging device 5 is glued to the three-dimensional substrate 2.

While there has been described what are at present considered to be preferred embodiments of the invention, it will be understood that various modifications may be made thereto, and it is intended that appended claims cover all such modifications as fall within the true spirit and scope of the invention.

INDUSTRIAL APPLICABILITY

As described above, in the invention, even when filler contained in an adhesive for bonding an optical filter and a semiconductor imaging device is released at the time of adhesion or drops after cure of the adhesive, outputs from the surrounding pixels can certainly be obtained because the diameter of the filler attached to the surface of the semiconductor imaging device is smaller than or equal to the pixel size. Based on the outputs from the surrounding pixels, an image correction can be made and the image can be corrected to a state where there is substantially no filler, so that degradation of image quality can be reduced. The invention can provide these great advantages and is useful as an imaging apparatus or the like.

The invention claimed is:

1. An imaging apparatus comprising:
   a semiconductor imaging device which converts incident light to an electrical signal;
   an optical filter which is opposed to an incident surface of said semiconductor imaging device and transmits light of a certain wavelength; and
   a fixing member fixing said optical filter by means of adhesion using a filler-containing adhesive;
   wherein a diameter of said filler is smaller than or equal to a pixel size of said semiconductor imaging device.

2. The imaging apparatus according to claim 1, wherein said fixing member is a three-dimensional substrate.

3. An imaging apparatus comprising:
   a semiconductor imaging device which converts incident light to an electrical signal; and
   a substrate fixing said semiconductor imaging device by means of adhesion using a filler-containing adhesive;
   wherein a diameter of said filler is smaller than or equal to a pixel size of said semiconductor imaging device.

4. The imaging apparatus according to claim 1 or 3, wherein said diameter of said filler is larger than or equal to ½ of a pixel size of said semiconductor imaging device.

5. The imaging apparatus according to claim 1 or 3, wherein said filler is spherical in shape.

6. The imagining apparatus according to claim 1 or 3, wherein said diameter of said filler is smaller than or equal to 3.8 μm.

7. A method of manufacturing an imaging apparatus comprising the steps of:
   providing a substrate;
   providing a semiconductor imaging device which converts incident light to an electrical signal, wherein the semiconductor imaging device has a pixel size;
   mounting the semiconductor imaging device to the substrate;
   providing an optical filter which transmits light of a certain wavelength;
   selecting a filler-containing adhesive based on a diameter of the filler being smaller than or equal to the pixel size; and
   mounting the optical filter to the substrate by means of adhesion using the filler-containing adhesive.

8. The method of claim 7, wherein the diameter of the filler is larger than or equal to ½ of the pixel size.

9. The method of claim 7, wherein the filler is spherical in shape.

10. The method of claim 7, wherein the diameter of the filler is smaller than or equal to 3.8 μm.

11. A method of manufacturing an imaging apparatus comprising the steps of:
    providing a substrate;
    providing an optical filter which transmits light of a certain wavelength;
    mounting the optical filter to the substrate;
    providing a semiconductor imaging device which converts incident light to an electrical signal, wherein the semiconductor imaging device has a pixel size;
    selecting a filler-containing adhesive based on a diameter of the filler being smaller than or equal to the pixel size; and
    mounting the semiconductor imaging device to the substrate by means of adhesion using the filler-containing adhesive.

12. The method of claim 1, wherein the diameter of the filler is larger than or equal to ½ of the pixel size.

13. The method of claim 11, wherein the filler is spherical in shape.

14. The method of claim 11, wherein the diameter of the filler is smaller than or equal to 3.8 µm.

* * * * *